(12) United States Patent
Belady et al.

(10) Patent No.: US 7,551,440 B2
(45) Date of Patent: Jun. 23, 2009

(54) SYSTEM AND METHOD FOR COOLING AN ELECTRONIC COMPONENT

(75) Inventors: Christian Belady, McKinney, TX (US); Darius Tanksalvala, Longmont, CO (US); Gary Gostin, Plano, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 35 days.

(21) Appl. No.: 11/657,145

(22) Filed: Jan. 24, 2007

(65) Prior Publication Data

US 2008/0174962 A1 Jul. 24, 2008

(51) Int. Cl.
*H05K 7/20* (2006.01)

(52) U.S. Cl. .................... 361/699; 361/701; 361/702; 361/716; 361/721; 165/80.4; 165/104.33

(58) Field of Classification Search .................. None
See application file for complete search history.

(56) References Cited

U.S. PATENT DOCUMENTS

| | | | |
|---|---|---|---|
| 5,285,347 A * | 2/1994 | Fox et al. .................... 361/699 |
| 5,365,749 A * | 11/1994 | Porter ........................ 62/259.2 |
| 5,473,508 A * | 12/1995 | Porter et al. ................. 361/695 |
| 6,133,631 A | 10/2000 | Belady |
| 6,152,213 A | 11/2000 | Suzuki |
| 6,313,992 B1 | 11/2001 | Hildebrandt |
| 6,351,381 B1 * | 2/2002 | Bilski et al. ................. 361/695 |
| 6,377,453 B1 | 4/2002 | Belady |
| 6,504,721 B1 | 1/2003 | Watwe et al. |
| 6,625,021 B1 | 9/2003 | Loftland et al. |
| 6,628,520 B2 * | 9/2003 | Patel et al. ................... 361/696 |
| 6,648,062 B2 | 11/2003 | Fukazu et al. |
| 6,661,660 B2 | 12/2003 | Prasher et al. |
| 6,693,797 B2 | 2/2004 | Fancuf et al. |
| 6,807,056 B2 * | 10/2004 | Kondo et al. ................ 361/689 |
| 6,828,675 B2 | 12/2004 | Memory et al. |
| 6,856,509 B2 * | 2/2005 | Lin ............................ 361/685 |
| 6,937,471 B1 | 8/2005 | Haws et al. |
| 6,970,355 B2 * | 11/2005 | Ellsworth et al. ........... 361/694 |
| 6,983,789 B2 * | 1/2006 | Jenkins et al. ............. 165/80.3 |
| 7,057,894 B2 | 6/2006 | Chang |
| 7,081,671 B2 | 7/2006 | Fukada et al. |
| 7,092,255 B2 | 8/2006 | Barson et al. |
| 7,120,021 B2 * | 10/2006 | Hamman ..................... 361/699 |
| 7,203,063 B2 * | 4/2007 | Bash et al. ................... 361/699 |
| 7,219,714 B1 * | 5/2007 | Heydari ..................... 165/80.4 |
| 7,280,358 B2 * | 10/2007 | Malone et al. .............. 361/701 |
| 7,317,614 B2 * | 1/2008 | Ruch et al. .................. 361/687 |
| 7,318,322 B2 * | 1/2008 | Ota et al. .................... 62/259.2 |
| 7,355,852 B2 * | 4/2008 | Pfahnl ........................ 361/699 |
| 2005/0061541 A1 | 3/2005 | Belady |
| 2005/0259392 A1 | 11/2005 | Vinson et al. |
| 2006/0133039 A1 | 6/2006 | Belady |
| 2006/0232932 A1 | 10/2006 | Curtis et al. |
| 2007/0089859 A1 * | 4/2007 | Wei ............................ 165/80.4 |
| 2007/0125523 A1 * | 6/2007 | Bhatti et al. ........... 165/104.33 |

\* cited by examiner

*Primary Examiner*—Boris L Chervinsky

(57) ABSTRACT

A cooling system has at least one heat conducting element in thermal contact with an electronic component. A heat exchanger is in fluid communication with the heat conducting element. The heat exchanger is configured to provide a working fluid to the at least one heat conducting element to facilitate dissipation of heat from the respective electronic component. The heat exchanger has a form factor dimensioned and configured for mounting in a preconfigured hardware unit slot of a computer chassis.

24 Claims, 3 Drawing Sheets

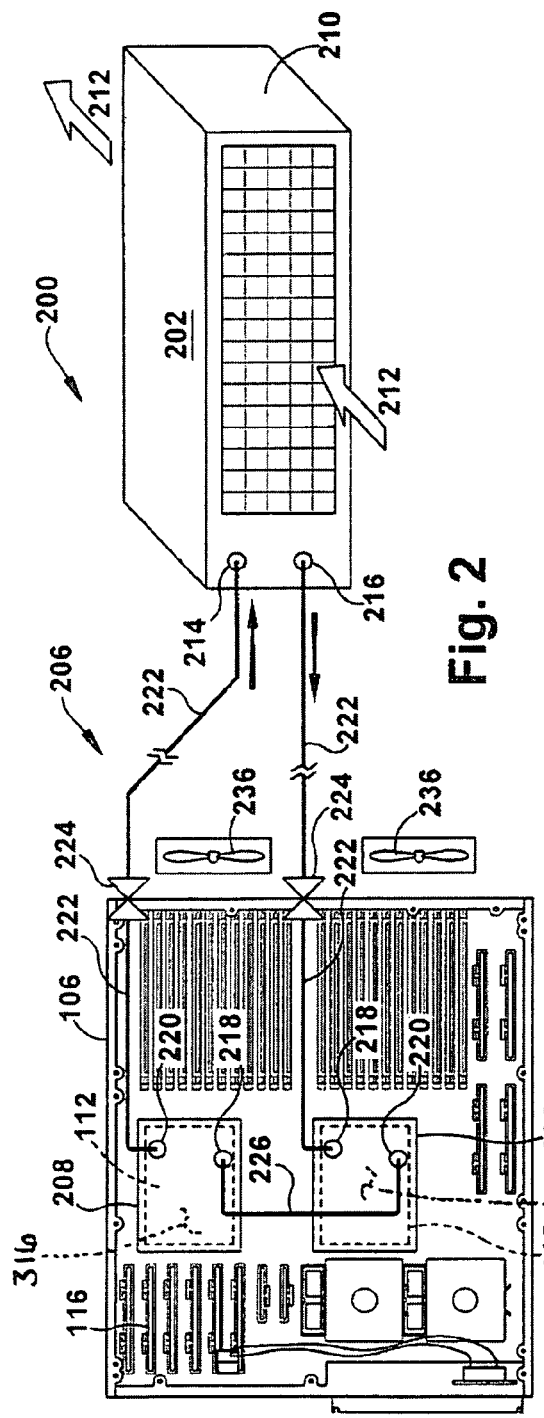
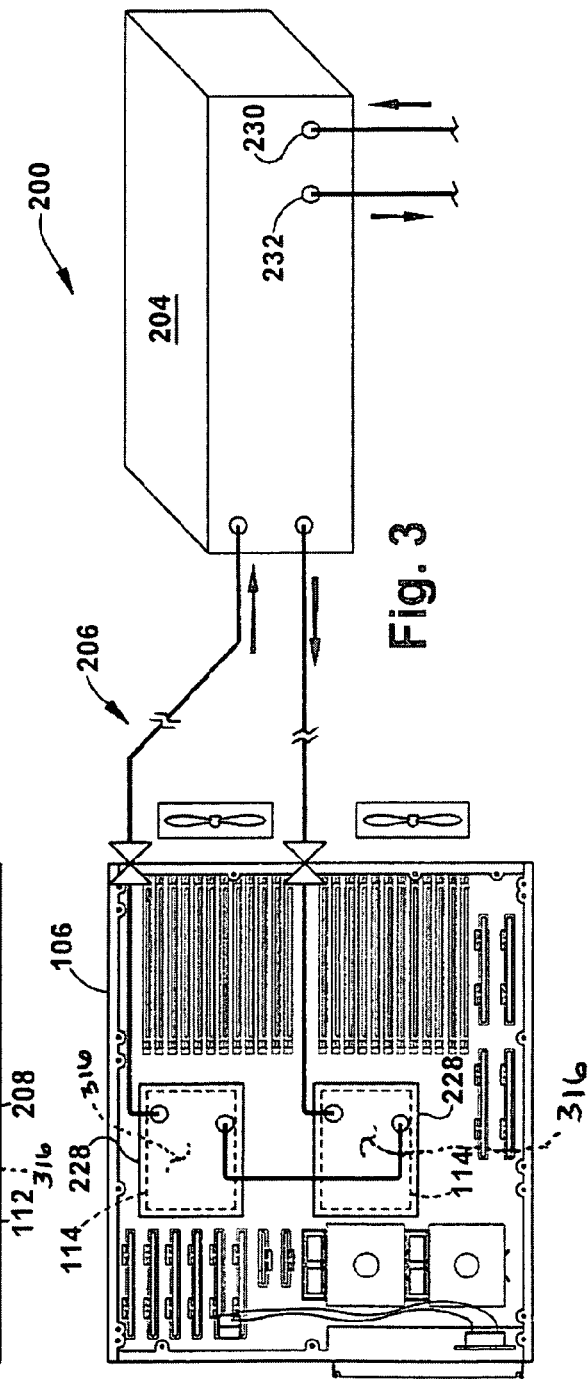
Fig. 2
Fig. 3

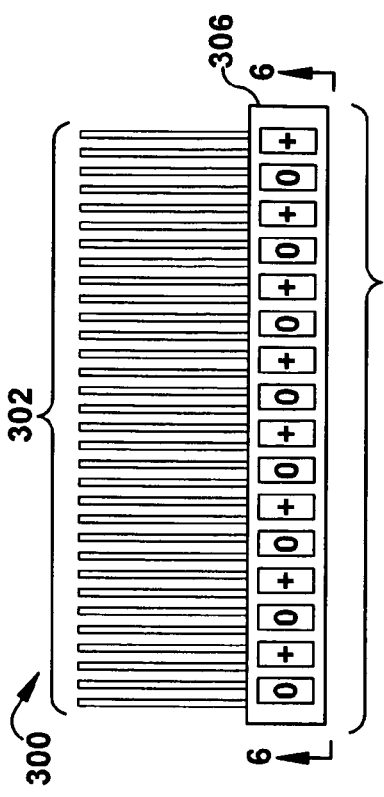
Fig. 5
Fig. 4
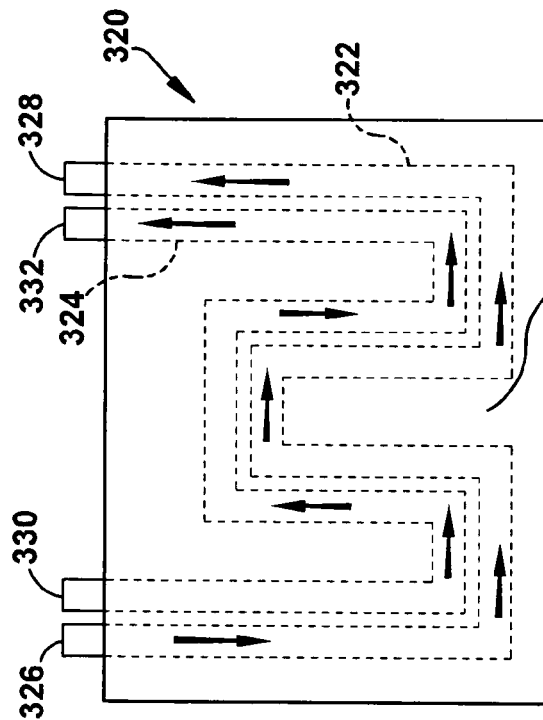
Fig. 7
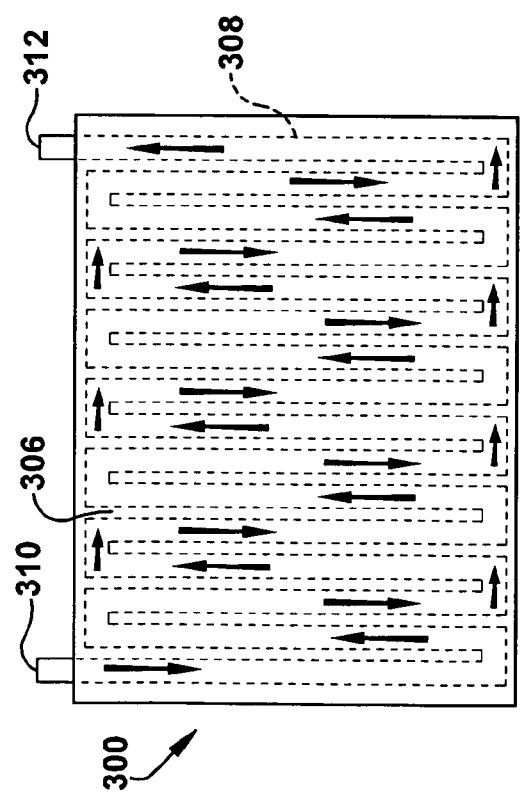
Fig. 6

SYSTEM AND METHOD FOR COOLING AN ELECTRONIC COMPONENT

BACKGROUND

High speed electronic components produce unwanted heat during operation. For example, electronic components such as microprocessors, graphics processors, and the like generate heat that can be removed for more efficient operation. Heat removal provides for a lower operating temperature of the electronic components, thus allowing higher operating speeds and greater computing power than uncooled electronic components.

Various cooling schemes are known. In general, as cooling schemes become more effective, mechanisms to implement the schemes become larger, heavier, more complicated, and more difficult to install and physically accommodate in computer systems or facilities. Moreover, the traditional forced-air cooling systems may simply be unable to remove a sufficient amount of heat to allow reliable operation of the newest and most advanced electronic components.

BRIEF DESCRIPTION OF THE DRAWINGS

FIG. 2 is a schematic view of a first embodiment of a cooling system according to the present invention.

FIG. 3 is a schematic view of a second embodiment of a cooling system according to the present invention.

FIG. 4 is a partial front perspective view of a heat sink according to an embodiment.

FIG. 5 is a cross-section taken along line 5-5 of FIG. 4.

FIG. 6 is a schematic view of an interior of a heat sink according to a first embodiment.

FIG. 7 is a schematic view of an interior of a heat sink according to a second embodiment.

DETAILED DESCRIPTION

Figure 1:
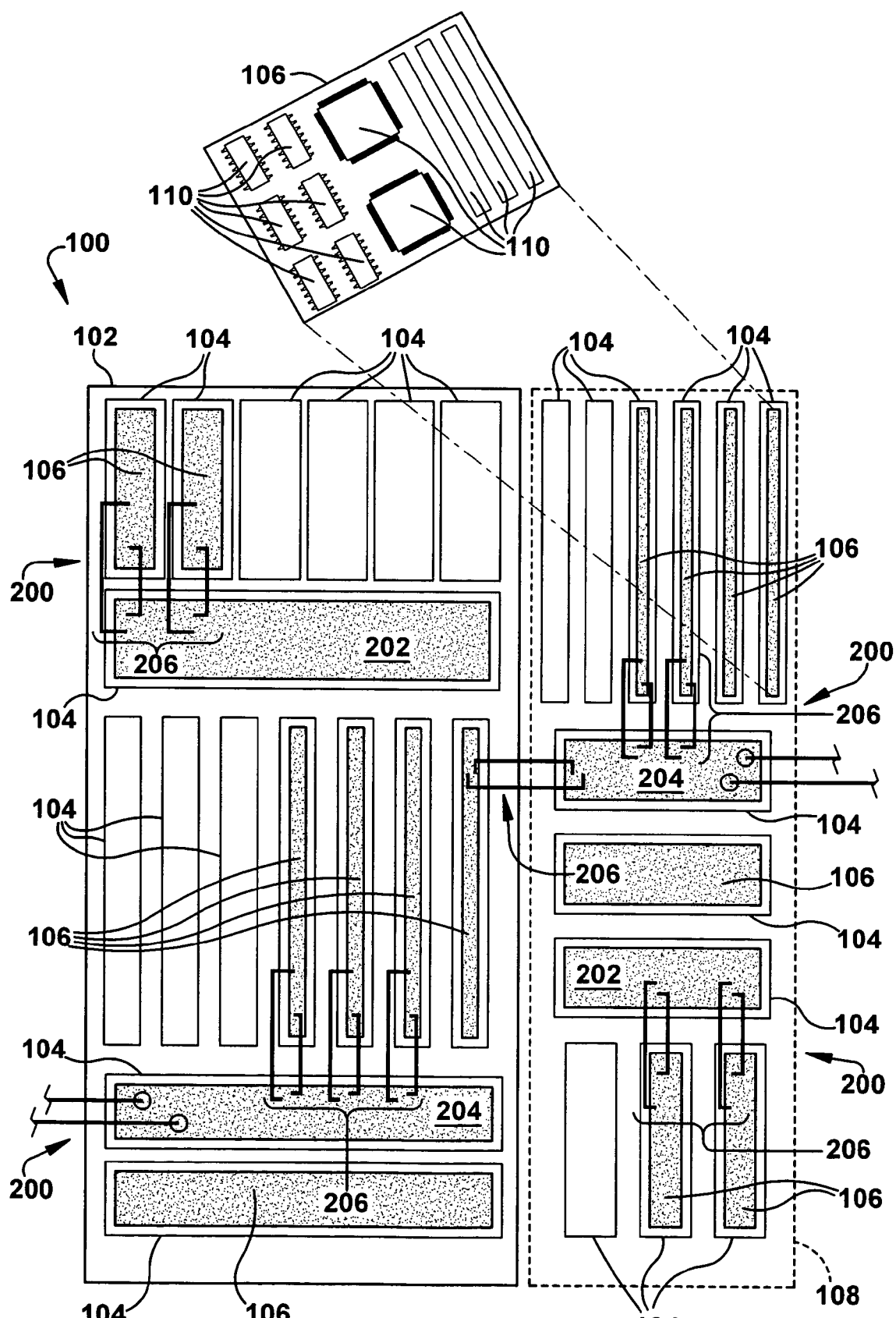
FIG. 1 is a partially exploded front view of an embodiment of a cooling system implemented in a computer system.

FIG. 1 depicts a computer system 100 having a computer chassis (or cabinet) 102. The size, configuration, form factor, material, and other physical properties of any computer chassis, including those shown, are determined by the manufacturer of the computer system 100 and need not be of any particular type. The computer system 100 may be a portion of a network of computer systems 100 (such as a group of one or more servers, each of which may be arranged in or carried by a rack (not shown)), and may be located within a dedicated computing facility (not shown). The dedicated computing facility may include climate control or other systems (not shown) to regulate an ambient temperature within the facility.

The computer chassis 102 has a plurality of preconfigured hardware unit slots, shown here as either empty or filled circuit board slots 104, for receiving modular circuit boards or cards 106. The circuit board slots 104 are each preconfigured to receive a specific type and form factor of circuit board 106. Examples of suitable preconfigurations of circuit board slots 104 include those designed to accept and securely hold I/O chassis, power supplies, processor cell boards, protocol data units, memory modules, disk drives, mass storage adapter cards, interface cards, and the like, all of which will be referred to herein as circuit boards 106. Any number of the plurality of circuit board slots 104 may be in use at any given time, and one of ordinary skill in the art can readily install, remove, and replace circuit boards 106 within the circuit board slots 104 as needed for a particular application.

In addition to the computer chassis 102, the computer system 100 may include a supplemental chassis or rack (e.g., a cabinet) 108, such as the expansion rack shown in dashed line in FIG. 1. The supplemental rack 108 can be connected to or positioned adjacent to the computer chassis 102. Like the computer chassis 102, the supplemental rack 108 also has a plurality of preconfigured circuit board slots 104 for receiving modular circuit boards 106, which may be the same as or different than any of the circuit board slots 104 available in the computer chassis 102 and the circuit boards 106 mounted in the computer chassis 102. Commonly, a supplemental chassis 108 is provided when a certain type of circuit board slots 104 are filled on the computer chassis 102, but economic, physical, or other limitations at least temporarily prevent the user from obtaining a second computer chassis 102 for mounting additionally needed circuit boards 106 of that type. The circuit board slots 104 and circuit boards 106 discussed herein may be mounted in either of the computer chassis 102 or a supplemental chassis 108 without distinction.

In FIG. 1, for example, a circuit board 106 is depicted in an exploded view relative to the chassis 102. Each circuit board 106 carries at least one electronic component 110. The type of electronic component 110 varies according to the intended function of the circuit board 106. For example, the circuit board 110 shown in the exploded view of FIG. 1 can be a processing cell board and carries one or more memory modules, one or more processor modules, and voltage regulation modules as well as other circuitry configured to perform the functions associated with the board and components thereof. Each electronic component 110 may be an integrated circuit chip or be of any other suitable type, and may have processing, memory, input/output, voltage regulating, or any other suitable functions.

A wide variety of combinations of computer chassis 102, circuit board slots 104, circuit boards 106, electronic components 110, connecting traces (omitted herein for clarity), and other parts of the computer system 100 are possible and may be readily designed, chosen, and/or arranged by one of ordinary skill in the art. Regardless of the specific structural and functional details of the computer system 100, however, a cooling system 200 may be provided to remove unwanted heat from the computer system 100.

FIG. 1 depicts several example embodiments of a cooling system 200 that can be incorporated into the computer system 100. Each cooling system 200 includes at least one heat exchanger mounted in a preconfigured circuit board slot 104. The heat exchanger may cool a working fluid (not shown) using at least one of a fluid-to-fluid cooling (e.g., liquid-to-air cooling, liquid-to-liquid cooling, air-to-air cooling, or air-to-liquid cooling) and phase change refrigeration cooling. For example, phase change cooling employs a refrigerant operating as a transport medium. Those skilled in the art will understand various types of refrigerants that can be utilized. When phase change refrigeration cooling is used, the cooling system may be a closed system and the heat exchanger may include a pump/compressor system (not shown) operable in a known manner to provide refrigeration to the working fluid. The closed loop can also include a pressure relief valve (not shown) to vent the cooling system 200, such as if the liquid working fluid inadvertently boils and changes into a gaseous state.

In the example of FIG. 1, air-cooled heat exchangers 202 are mounted in certain preconfigured circuit board slots 104. By way of further example, the cooling system can also include liquid-cooled heat exchangers 204 mounted in different preconfigured circuit slots 104. The heat exchangers 202 and 204 may be mounted instead of correspondingly dimensioned and configured circuit boards 106 in the appropriately preconfigured circuit board slots 104. For instance, the heat exchangers 202 and 204 may be exchanged with circuit boards 106 in the same circuit board slots 104. As one example, a selected circuit board (e.g., an I/O chassis, server, or other circuit board) 106 can be displaced from its original unit slot of the chassis 102 and be installed in another associated slot, which can be in the computer chassis 102 or the expansion rack 108. An appropriate heat exchanger 202, 204 can, in turn, be mounted in the empty space where the selected circuit board 106 was previously located.

The heat exchangers 202 and 204 are not restricted to mounting in any one type of preconfigured circuit board slot 104, but may have a form factor configured for mounting in any chosen type of preconfigured circuit board slots 104. It is contemplated that the form factor could encompass any number of contiguous circuit board slots 104 up to and including an entire server in a rack. Myriad configurations and arrangements of heat exchangers 202 and 204 in preconfigured circuit board slots 104, other than those shown, are possible. Both the air- and liquid-cooled heat exchangers 202 and 204 are connected, through cooling loops 206, to a plurality of heat sinks (not visible in this view, see, e.g., FIGS. 2 and 3).

FIG. 2 depicts an example configuration for the cooling system 200. The cooling system 200 includes at least one heat conducting element. The heat conducting element can be formed of a thermal conductive material, such as a metal, an alloy, a thermally conductive plastic or combinations thereof. For sake of consistency, the heat conducting element is shown and described herein as a heat sink 208. The heat sink 208 is in thermal contact with a chosen electronic component 112, such as in phantom line in FIG. 2. For example, the electronic component can be a microprocessor or other component (e.g., an integrated circuit chip) for which cooling is desired for improved performance. It is contemplated that the heat sink 208 may be in direct thermal contact with the chosen electronic component 112 or may be indirectly thermally connected with the chosen electronic component, such as through a conventional heat sink (not shown). Additionally, a thermally conductive material (e.g., a thermally conductive grease or other material having suitable viscosity and thermal properties to facilitate heat transfer) can be interposed between the heat sink 208 and the electronic component 112 to facilitate heat transfer from the component to the heat sink.

In the example, of FIG. 2, the cooling system includes an air-cooled heat exchanger (or cooling unit) 202 that is in fluid communication with at least one heat sink 208. The heat exchanger 202 is configured to provide the working fluid to the heat sink 208 to facilitate dissipation of heat from the electronic component 112 associated with that heat sink 208. As used herein, the term "fluid" is intended to encompass both liquids and gasses.

The heat exchanger 202 shown in FIG. 2 has a form factor dimensioned and configured for mounting in a preconfigured circuit board slot 104 of the computer chassis 102 (FIG. 1). The form factor of the heat exchanger 202 allows the heat exchanger to be mounted in the computer chassis 102 (or in a supplemental chassis 108) in place of a circuit board 106 or other hardware unit for which the circuit board slot 104 was preconfigured or designed. For example, the heat exchanger 202 may be designed for, and mountable in, an I/O chassis slot, a power supply slot, a slot for a processor cell board, a protocol data unit slot, or other circuit board slot 104 or contiguous group of circuit board slots (not shown) designed for any other member, structure, or subassembly normally available for use with the computer system 100, up to and including a slot for an entire server.

The heat exchanger 202 either may be swapped out with a circuit board 106 of the corresponding preconfiguration, or may be placed into a formerly empty circuit board slot 104 originally preconfigured and intended to hold a corresponding circuit board 106. In such a manner, the cooling system 200 can be provided to a computer system 100 either as a retrofit or as an original manufacturer installation without requiring specialized mounting brackets or locations on or near the computer chassis 102 for the heat exchanger 202. Additionally, remote location of the heat exchanger 202 is avoided, thus minimizing the length of tubing needed to reach the heat sink 208 and accordingly reducing the chance of undesirable fluid and/or thermal leakage from the tubing. Moreover, the cooling system 200 can be provided in the same rack as the computer system 100, thus saving space in the computing facility. The heat exchanger 202 further can be configured to electrically connect to a power bus in a given slot, such as for powering operation of the heat exchanger. The heat exchanger 202 could additionally or alternatively connect to other power and control systems, including those associated with the computer system 100, rack, or computing facility, for powering, monitoring, and/or controlling any aspects of the cooling system 200. Those skilled in the art will understand and appreciate various types of connections and power sources that can be employed to provide electrical power to the heat exchanger 202.

The heat exchanger 202 may be contained within a heat exchanger housing 210. When present, the heat exchanger housing 210 may contain and/or protect the components of the heat exchanger 202. Such heat exchanger housing 210 will have the form factor dimensioned and configured for mounting in the preconfigured circuit board slot 104. The heat exchanger housing 210 may also, or alternatively, contain a plurality of heat exchangers 202 and allow the plurality of heat exchangers to be mounted together into a chosen preconfigured circuit board slot 104, if the individual heat exchangers 202 are smaller than the chosen circuit board slot. A plurality of heat exchangers 202 can also or instead be configured to concurrently fit in a chosen preconfigured circuit board slot 104 without the use of a heat exchanger housing 210. As another alternative, the heat exchanger housing 210 may be so dimensioned to occupy more than one contiguous slot.

A cooling loop 206, which may be a liquid cooling loop, fluidly connects the heat sink 208 and the heat exchanger 202, such as shown in FIGS. 2 and 3. The working fluid circulates in the cooling loop 206 to dissipate heat from the electronic component 112, and the heat exchanger 202 cools the working fluid with a cooling fluid (not shown). The working fluid and cooling fluid may each be of any suitable type, such as air or another gas, or water or another fluid, and need not be of the same type. For example, ethylene glycol could be used as a working fluid, with the cooling fluid being flowing ambient air in the case of an air-cooled heat exchanger 202 or being an externally supplied cooling fluid in the case of a liquid-cooled heat exchanger 204. For example, air may be blown (e.g., by one or more fans) in a first direction, indicated by arrows 212, over the air-cooled heat exchanger 202 to cool the working fluid flowing through the heat exchanger in a fluid-to-air manner. As another example (not shown), a refrigeration cycle heat exchanger compresses and expands a working fluid in a known manner and supplies the working fluid through an appropriate cooling loop (not shown). However, this description presumes air-cooled or liquid-cooled heat exchangers 202 and 204, respectively, for clarity of description.

Regardless of the mechanism of cooling operation of the heat exchanger 202, the working fluid flows through the cooling loop 206 such as shown in FIG. 2, to alternately absorb heat from the electronic component 112 and dissipate heat through the heat exchanger 202. The heat exchanger 202 has a heat exchanger inlet port 214 in fluid communication with a heat exchanger outlet port 216. The heat sink 208 has a heat sink inlet port 218 in fluid communication with a heat sink outlet port 220. A plurality of rigid or flexible working fluid lines 222 carry the working fluid through the cooling loop 206 and provide a fluid connection between the heat exchanger 202 and the heat sink 208. As shown in FIG. 2, there may be couplings 224 provided on the working fluid lines 222 to facilitate assembly, repair, or replacement of the cooling system 200. When present, the couplings 224 may be of the quick-connect type and may be mounted on the circuit board 106 to enable modular assembly of the cooling system 200. Also as shown in FIG. 2, there may be one or more connecting lines 226 provided to route working fluid from a heat sink outlet port 220 on one heat sink 208 directly to a heat sink inlet port 218 on a different heat sink 202. When such a serial cooling arrangement is used, the heat exchanger 202 capacity should be chosen to provide adequate cooling capacity to both of the heat sinks 208.

The cooling system 200 may have any one of a number of different configurations and structures. There may be one or more heat sinks 208 in fluid communication with a single heat exchanger, as shown in FIG. 2. Additionally or alternatively, there may be one or more heat exchangers in fluid communication with a single heat sink 208, as described below. Multiple heat sinks 208, when present in the same cooling loop 206, may be arranged in series or in parallel, and each may be associated with any of a number of circuit boards 106. A cooling system 200 may include any number, type, or combination of heat sinks 208 and heat exchangers. One or more cooling systems 200 could be associated with each computer system 100. It is contemplated that a single heat exchanger could be configured to work alternately or simultaneously as both an air-cooled type heat exchanger 202 and a liquid-cooled type heat exchanger 204, possibly by including fittings and structures for both types in a single heat exchanger unit and thereby offering greater flexibility and modularity to the cooling system 200.

FIG. 3 depicts a circuit board 106 and a cooling loop 206 in a second configuration according to an embodiment. While the circuit board 106 and cooling loop 206 depicted in FIG. 3 appear to be substantially the same as the circuit board 106 and cooling loop 206 shown and described above with reference to FIGS. 1 and 2, one of ordinary skill in the art can readily understand that various configurations could have components, arrangements, formats, aspects, and the like different from those shown. For sake of brevity, a description of common elements and their operation similar to those in the previously described to the example of FIG. 2 will not be repeated with respect to the example configuration depicted in the example of FIG. 3.

A liquid-cooled heat exchanger 204 is in fluid communication with at least one heat sink 228 in the example shown in FIG. 3. The heat exchanger 204 is configured to provide a working fluid (not shown) to the heat sink 228 to facilitate dissipation of heat from a chosen electronic component 114 (shown in phantom line in FIG. 3) associated with that heat sink 210. An external cooling fluid (not shown), such as a building coolant fluid, may be supplied to the liquid-cooled heat exchanger 204 through an external coolant inlet 230 and removed from the heat exchanger through an external coolant outlet 232 to remove heat from the working fluid in a fluid-to-fluid manner.

One example of a heat sink 300 that can be utilized in a cooling system is depicted in FIGS. 4 and 5. In FIG. 4, the heat sink 300 is shown as having at least one cooling fin 302, with each cooling fin 302 being adapted to dissipate heat from the electronic component into an ambient fluid, such as the surrounding air within the computer chassis. When present, the cooling fins 302 may act to supplement the cooling effects provided by the cooling system or to provide backup cooling if the cooling system should fail. One or more fans (such as those shown in FIG. 2) may be provided to direct at least a portion of the ambient air within the computer chassis over the heat sink 300. These fans may be provided whether or not cooling fins 302 are provided to the heat sink 300. For example, such directed ambient airflow may be desirable in cooling an unfinned/flat-top heat sink (not shown) or other electronic components which do not have an associated heat sink.

The cooling fins 302 may be used to provide a relatively low level of cooling to a chosen electronic component to which no cooling loop is thermally connected. For example, a heat sink 300 compatible with the cooling system could be provided to a chosen electronic component at the time of initial manufacture, the chosen electronic component intended to operate at a low-power setting with the heat sink 300 having no working fluid lines attached thereto. In this manner, a cooling system could be formed at a later time (e.g., by a retrofit installation) by the attachment of a cooling loop to the heat sink 300, to provide a higher level of cooling, such as when the electronic component is used at a higher power without necessitating replacement of the heat sink 300. Use of the electronic component at a higher power is generally associated with higher available frequency use and therefore a higher level of performance.

It is desirable to form a sufficient thermal contact between the heat sink and the electronic component residing on the board. The thermal contact can be improved by increasing the contact surface area between the heat sink and the electronic component being cooled. By way of further example, with reference between FIGS. 1, 2 and 4, the heat sink 208, 300 may be directly installed on, or mounted to, the electronic component 112. The contact surface area can be increased by reducing manufacturing tolerances. Alternatively, and more typically, a thermal transfer material (e.g., a thermally conductive grease, pad, or the like (not shown)) can be placed between the heat sink and the electronic component to enhance the thermal connection. In some circumstances, the heat sink 208, 300 may be attached to the electronic component 112 with an intermediate member therebetween. For example, and particularly when the cooling system 200 is installed as a field retrofit for an existing computer system 100, the heat sink 208, 300 may be placed into thermal contact with a preexisting heat sink (not shown) associated with the chosen electronic component 112. In such case, a suitable viscous thermal transfer material 316 could also be provided between the heat sink 208, 300 and the preexisting heat sink. The heat sink 208, 300 could also include a structure (such as bottom fins) designed to mate with a structure of the preexisting heat sink, to enhance thermal contact therebetween. A thermal transfer material 316 can be used in such a case as well to increase the heat transfer between the structures. Those skilled in the art will understand and appreciate various type of thermal grease and other materials that can be utilized as a thermal transfer material 316.

FIG. 5 is a cross-sectional view of the heat sink 300 of FIG. 4, taken along the line 5-5. The heat sink 300 is shown as having a heat conducting body 306 and a plurality of cooling fins 302. At least one channel 308 extends through the heat conducting body 306, with the channel 308 being equipped for fluid connection with the cooling loop. The channel 308 accepts working fluid from the heat exchanger, facilitates transfer of heat from the electronic component into the working fluid, and directs the working fluid back to the heat exchanger. The cross-section of FIG. 5 is taken across the width of a serpentine channel 308, and the working fluid flows back and forth through the channel within the heat sink 300 to absorb heat. More specifically, the working fluid alternately flows out of the plane of FIG. 5 (as represented by the "o" markings) and into the plane of FIG. 5 (as represented by the "+" markings). As another example (not shown), the channel 308 may simply be a hollow area within the heat sink 300. Instead of being directed by a serpentine structure, the working fluid in the latter arrangement would pass through the hollow area driven by fluid pressure generated by the cooling loop 206, possibly in a turbulent and/or undirected manner, between the heat sink inlet port 310 and the heat sink outlet port 312. Other arrangements of working fluid flow within the heat sink 300 are contemplated, in addition to or instead of the depicted channels. The working fluid could flow in parallel paths, such as in stacked cold plates, and/or in cooling structures with brazed finstock, to name a few examples.

FIG. 6 schematically depicts an example of a first configuration of an interior structure of a heat sink 300 (shown in FIGS. 4 and 5). In FIG. 6, the interior is depicted as including a single serpentine channel 308 that extends between, and fluidly connects, the heat sink inlet port 310 and the heat sink outlet port 312.

FIG. 7 schematically depicts an example of a second configuration of an interior structure of the heat sink 320. The heat sink body 334 of FIG. 7 includes to a first serpentine channel 322 fluidly connecting inlent and outlet ports 326 and 328. The heat sink body 334 also includes a second serpentine channel 324 extending between, and fluidly connecting, a second heat sink inlet port 330 and a second heat sink outlet port 332. While the example of FIG. 7 depicts two channels, more than two channels could be utilized.

The FIG. 7 arrangement may be used, for example, when a second heat exchanger (not shown) is provided, for redundancy in the cooling system. If, for some reason, the first heat exchanger or the associated cooling loop should fail, then the second heat exchanger and an associated second cooling loop (not shown) could be available to provide at least a controlled shutdown mode and avoid heat damage to the computer system due to the failed component(s). Alternately, the same heat exchanger could be used to provide cooling fluid to both channels 322 and 324. Even in regular (non-failure) operation, the first and second serpentine channels 322 and 324 may be simultaneously used to dissipate heat from the electronic component, if desired. One of ordinary skill in the art could readily design a heat sink 320 including any suitable number, configuration, size, positioning, and arrangement of channel(s) 322 and 324 for a desired application.

To cool at least one chosen electronic component 112 mounted on a circuit board 106 within a computer chassis 102, the cooling system 200 may be installed, such as shown in FIGS. 1, 2, and 3. Namely, a heat sink 208 is placed into direct or indirect thermal contact with the chosen electronic component 112. A heat exchanger 202 or 204 is mounted in a preconfigured circuit board slot 104 within the computer chassis 102 or an adjacent computer chassis 102 or supplemental chassis 108. The heat sink 208 is placed into fluid communication with the heat exchanger 202 or 204 through a cooling loop 206. Working fluid is provided to the heat sink 208 from the heat exchanger 202 or 204, the working fluid absorbs heat from the electronic component 112, and the working fluid is returned to the heat exchanger from the heat sink. The heat exchanger 202 or 204 cools the working fluid. The now-cooled working fluid then re-enters the cooling loop 206 for ongoing cooling of the electronic component 112 or a different electronic component (not shown) if the heat exchanger 202 or 204 is used in a parallel cooling arrangement (not shown).

More specifically, working fluid in the cooling loop 206 exits the heat exchanger inlet port 214 at a first (cool side) temperature. The working fluid then travels through a working fluid line 222 toward the heat sink 208 and enters the heat sink 208 through the heat sink inlet port 218. The working fluid then enters the channel 322 within the heat conducting body 306 and absorbs heat conducted through the heat conducting body 238 from the electronic component 112. When the heat sink 208 includes one or more cooling fins 302, the cooling fins may act to dissipate heat from the electronic component 112 into the ambient air. The working fluid exits the heat sink 208 through the heat sink outlet port 220. The working fluid may then be directed to another heat sink 208 to provide cooling in a similar manner (as shown in the serial arrangement of FIGS. 2 and 3).

When the working fluid exits the heat sink outlet port 220 of the last heat sink 208 in a series (or of a single heat sink 208 when no series is present or when a parallel arrangement is used), the working fluid is at a second (hot side) temperature that is above the cool side temperature. The working fluid then travels through another working fluid line 222 and enters the heat exchanger 202 or 204 through the heat exchanger inlet port 214. The heat exchanger 202 or 204 then cools the working fluid using at least one of flowing ambient air, an externally supplied cooling fluid, and phase change refrigeration cooling and directs the working fluid—again at a cool side temperature—out through the heat exchanger outlet port 216. This cycle is repeated as long as cooling of the electronic component 112 is desired.

It is contemplated that the cool side temperature may be below an ambient temperature near the heat sink 208. When the cool side temperature is so chosen, the heat sink 208 mounted on a first, associated, electronic component (e.g. electronic component 112, in FIG. 2) may also provide convection cooling to a proximately located second electronic component (e.g. electronic component 116 in FIG. 2). To do so, the working fluid cools the heat sink 208 enough to absorb heat not only from the thermally contacting first electronic component 112 but also from the ambient fluid around the heat sink (e.g., air within the computer chassis 102). Cooling fins 302 may therefore be provided to facilitate absorbing heat from the ambient fluid when the working fluid has sufficient heat-absorbing capacity, as well as to dissipate waste heat from the electronic component 112 when the working fluid is not able to absorb all of the waste heat. A fan 236 may assist in moving the ambient fluid to provide such convection cooling of a proximate second electronic component 116.

While aspects of the present invention have been particularly shown and described with reference to the preferred embodiment above, it will be understood by those of ordinary skill in the art that various additional embodiments may be contemplated without departing from the spirit and scope of the present invention. For example, the components and structures shown and described may be made of any material, and in any arrangement, configuration, or sizes as desired. The cooling system 200 could be run in reverse from the described order, to heat an electronic component 112 for an application with extreme ambient temperatures. Any number and type of heat sinks 208 could be associated with any number and type of electronic components 110 and any number and type of heat exchangers, in any desired combinations. A device or method incorporating any of these features should be understood to fall under the scope of the present invention as determined based upon the claims below and any equivalents thereof.

What have been described above are examples and embodiments of the invention. It is, of course, not possible to describe every conceivable combination of components or methodologies for purposes of describing the invention, but one of ordinary skill in the art will recognize that many further combinations and permutations of the present invention are possible. Accordingly, the invention is intended to embrace all such alterations, modifications and variations that fall within the scope of the appended claims. In the claims, unless otherwise indicated, the article "a" is to refer to "one or more than one".

What is claimed is:

1. A cooling system comprising:
   at least one heat conducting element in thermal contact with an electronic component; and
   a heat exchanger in fluid communication with the heat conducting element, the heat exchanger configured to provide a working fluid to the at least one heat conducting element to facilitate dissipation of heat from the respective electronic component, the heat exchanger having a form factor dimensioned and configured for mounting in a preconfigured hardware unit slot of a computer chassis, wherein the preconfigured hardware unit slot is configured to receive and electrically connect to a circuit board.

2. The cooling system of claim 1, further comprising a liquid cooling loop fluidly connecting the heat conducting element and the heat exchanger, the working fluid circulating in the cooling loop to dissipate heat from the electronic component, and the heat exchanger cooling the working fluid.

3. The cooling system of claim 2, wherein the heat conducting element further comprises a heat conducting body, and the heat conducting body includes at least one channel in fluid communication with the liquid cooling loop to accept working fluid from the heat exchanger, facilitate the transfer of heat from the electronic component into the working fluid, and direct the working fluid back to the heat exchanger.

4. The cooling system of claim 1, wherein the heat conducting element is in thermal contact with the electronic component through at least one of a thermal transfer material interposed between the electronic component and the heat conducting element.

5. The cooling system of claim 1, wherein the heat exchanger cools the working fluid using at least one of liquid-to-air cooling, liquid-to-liquid cooling, air-to-air cooling, air-to-liquid cooling, and phase change refrigeration cooling.

6. The cooling system of claim 1, further comprising an external source of a cooling fluid, the cooling fluid being supplied to the heat exchanger and being operative to at least partially remove heat from the working fluid through a fluid-to-fluid cooling process.

7. The cooling system of claim 1, wherein the electronic component is a first electronic component, a second electronic component is located proximate the first electronic component, the working fluid is provided to the heat conducting element from the heat exchanger at a temperature that is below an ambient temperature, and the heat conducting element provides cooling to the first electronic component through the working fluid and to the second electronic component through an ambient fluid.

8. The cooling system of claim 1, further comprising at least one fan operative to direct at least a portion of an ambient air within the computer chassis over the heat conducting element.

9. The cooling system of claim 1, wherein the at least one heat conducting element comprises a plurality of heat conducting elements, each being in thermal contact with a respective electronic component in the computer chassis, the heat exchanger being in fluid communication with two or more of the plurality of heat conducting elements to provide the working fluid to the plurality of heat conducting elements to facilitate dissipation of heat from the respective electronic components.

10. The cooling system of claim 1, wherein the form factor of the heat exchanger is dimensioned and configured for replacing a selected one of an I/O chassis, a printed circuit board, and a server in the computer chassis.

11. The cooling system of claim 1, wherein the heat exchanger is configured to be electrically connected to the preconfigured hardware unit slot.

12. A method of cooling at least one electronic component mounted on a hardware unit within a computer chassis, the method comprising:
    placing at least one heat conducting element into thermal contact with the electronic component;
    mounting a heat exchanger in a preconfigured hardware unit slot of the computer chassis, wherein the preconfigured hardware unit slot configured to receive and electronically connect to a circuit board; and
    selectively providing working fluid from the heat exchanger to the at least one heat conducting element to facilitate dissipation of heat from the respective electronic component.

13. The method of claim 12, further comprising:
    circulating a working fluid in a cooling loop that extends between the heat conducting element and the heat exchanger to dissipate heat from the electronic component; and
    cooling the working fluid with the heat exchanger.

14. The method of claim 13, wherein cooling the working fluid with the heat exchanger further comprises cooling the working fluid using at least one of flowing ambient air, an externally supplied cooling fluid, and phase change cooling.

15. The method of claim 13, wherein the electronic component is a first electronic component, and a second electronic component is located proximate the first electronic component, the method further comprising:
    providing the working fluid to the heat conducting element from the heat exchanger at a cool side temperature that is below an ambient temperature; and
    controlling flow of the working fluid to the heat conducting element to cool the first electronic component through the working fluid and to cool the second electronic component through an ambient fluid.

16. The method of claim 12, where the mounting further comprises:
    displacing the circuit board from the preconfigured hardware unit slot in the computer chassis to another location associated with the computer chassis; and
    mounting the heat exchanger in the preconfigured hardware unit slot in place of the displaced circuit board.

17. The method of claim 12, wherein mounting the heat exchanger in the preconfigured hardware unit slot comprises electrically connecting the heat exchanger to a power bus of the preconfigured hardware unit slot.

18. The method of claim 16, wherein displacing the circuit board comprises displacing one of an I/O chassis, a printed circuit board, and a server.

19. A computer system comprising:
- at least one modular circuit board, each modular circuit board carrying at least one integrated circuit chip;
- a computer chassis having a plurality of preconfigured circuit board slots dimensioned and configured for receiving and electrically connecting to modular circuit boards, the at least one modular circuit board being mounted in a corresponding one of the plurality of circuit board slots;
- at least one heat sink having a heat sink inlet port in fluid communication with a heat sink outlet port, the at least one heat sink being in thermal contact with a respective integrated circuit chip on the at least one modular circuit board;
- a heat exchanger mounted in another one of the plurality of preconfigured circuit board slots, the heat exchanger having a heat exchanger inlet port in fluid communication with a heat exchanger outlet port; and
- a working fluid circulating in a cooling loop that extends between the heat exchanger and the heat sink;
- the heat exchanger removing heat from the working fluid in cooperation with the cooling loop to dissipate heat from the respective integrated circuit chip.

20. The computer system of claim 19, wherein the integrated circuit chip is a first integrated circuit chip, a second integrated circuit chip is located proximate the first integrated circuit chip, the working fluid is provided to the heat sink from the heat exchanger at a temperature that is below an ambient temperature, and the heat sink provides cooling to the first integrated circuit chip through the working fluid and provides cooling to the second integrated circuit chip through an ambient fluid.

21. The computer system of claim 19, wherein the heat exchanger when mounted in the another preconfigured circuit board slot is electrically connected to the another preconfigured circuit board slot.

22. The computer system of claim 21, wherein the heat exchanger is electrically connected to a power bus of the another preconfigured hardware unit slot.

23. A system comprising:
- a plurality of circuit board slots, wherein the circuit board slots are configured to receive and electrically connect to respective circuit boards;
- circuit boards containing electronic components, the circuit boards mounted in some of the plurality of circuit board slots;
- a heat sink thermally contacted to one of the electronic components; and
- a heat exchanger thermally coupled to the heat sink, wherein the heat exchanger is mounted in another one of the plurality of circuit board slots.

24. The system of claim 23, wherein the heat exchanger is electrically connected to the another one of the circuit board slots.

* * * * *

UNITED STATES PATENT AND TRADEMARK OFFICE
CERTIFICATE OF CORRECTION

| | |
|---|---|
| PATENT NO. | : 7,551,440 B2 |
| APPLICATION NO. | : 11/657145 |
| DATED | : June 23, 2009 |
| INVENTOR(S) | : Christian Belady et al. |

It is certified that error appears in the above-identified patent and that said Letters Patent is hereby corrected as shown below:

In column 7, line 33, delete "inlent" and insert -- inlet --, therefor.

In column 10, line 29, in Claim 12, after "slot" insert -- is --.

Signed and Sealed this

Twenty-fourth Day of November, 2009

David J. Kappos
*Director of the United States Patent and Trademark Office*